March 9, 1965 T. G. STEHNEY 3,173,069

HIGH GAIN TRANSISTOR

Filed Feb. 15. 1961 2 Sheets-Sheet 1

INVENTOR.
THOMAS G. STEHNEY
BY
Frederick Shapoe
ATTORNEY

March 9, 1965 T. G. STEHNEY 3,173,069

HIGH GAIN TRANSISTOR

Filed Feb. 15. 1961 2 Sheets-Sheet 2

INVENTOR.
THOMAS G. STEHNEY
BY
Frederick Shapoe
ATTORNEY 3,173,069
Patented Mar. 9, 1965

3,173,069
HIGH GAIN TRANSISTOR

Thomas G. Stehney, Rillton, Pa., assignor to Westinghouse Electric Corporation, East Pittsburgh, Pa., a corporation of Pennsylvania
Filed Feb. 15, 1961, Ser. No. 89,498
1 Claim. (Cl. 317—235)

This invention relates to a high gain transistor in which three individual transistors are provided in a single structure.

In the copending application of Henkels and Nowalk, Serial No. 11,686, filed February 29, 1960, there is disclosed a novel high gain transistor that, in one embodiment, comprises a semiconductor wafer having a collector electrode on one major surface and a plurality of base and emitter electrodes on its other surface. Subsequent to that invention, a very high gain transistor was devised by Henkels and is disclosed in Serial No. 45,393, filed July 26, 1960, now Patent 3,103,599, issued September 10, 1963. In the Henkels device, a base drive transistor was added to the basic Henkels and Nowalk structure to result in a cascade of three transistors. The devices of those applications are examples of unitary devices that perform the functions of several single devices.

It is an object of the present invention to provide a novel semiconductor device that is the equivalent of three interconnected single devices, yet is a unitary structure that is internally cascaded and functions as a high gain transistor for high currents, that can be fabricated with known commercial techniques and materials at high reliability, and that is structurally simple.

These and other objects will be apparent from the following specification and the attached drawings in which.

Figure 1:
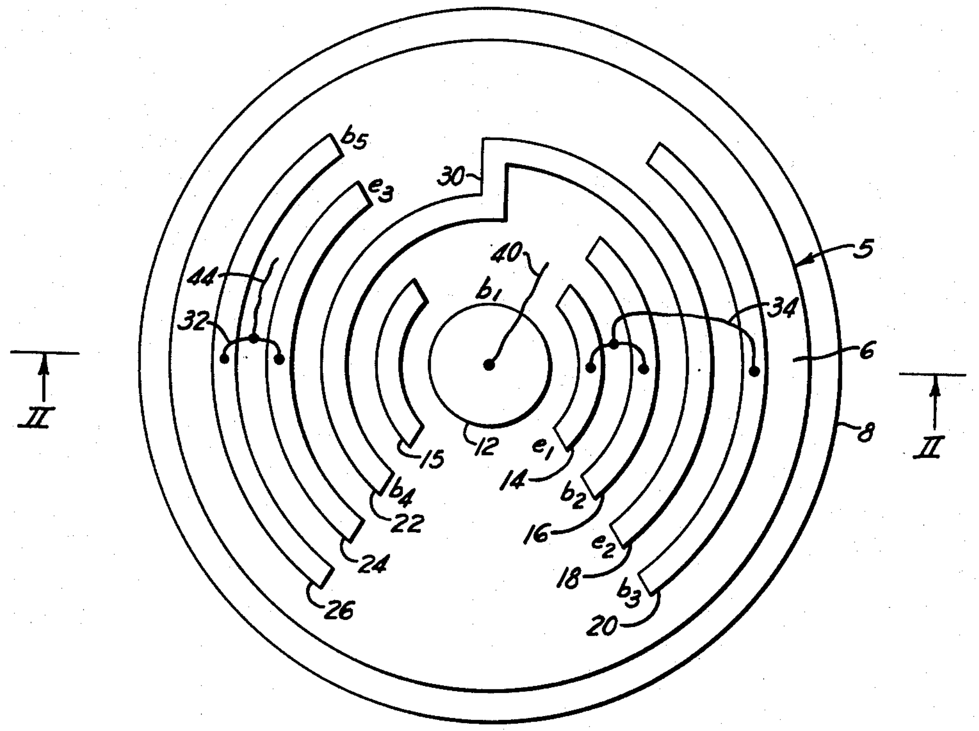
FIG. 1 is a top plan view showing the relative spacing of the various base and emitter electrodes on one major surface of a semiconductor body in accordance with this invention.

Referring now to the drawings, the device includes a first conductivity monocrystalline semiconductor wafer 5 having opposed major surfaces 6 and 7. On its bottom major surface 7 (see FIG. 2) is a large area collector electrode 8 having an impurity concentration that is opposite in conductivity type to that in the wafer 5 of the semiconductor material. Accordingly, there is formed in the body of semiconductor material 5 a first P-N junction 8*a*.

Figure 2:
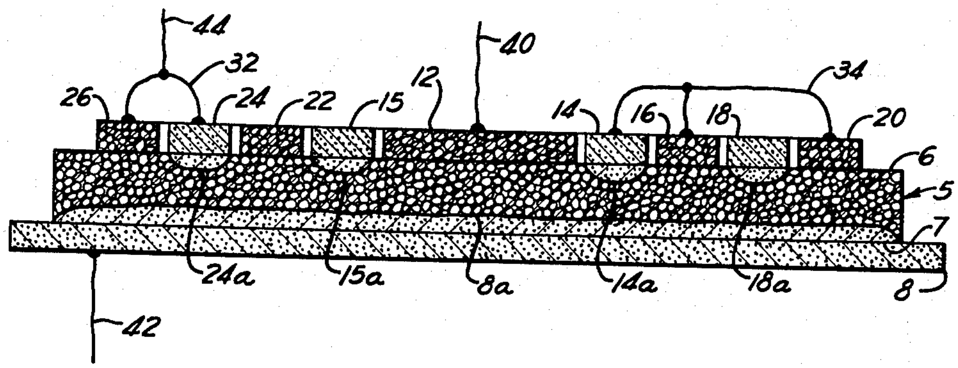
FIG. 2 is a section along lines II—II of FIG. 1.

On its other major surface 6, the body 5 of semiconductor material is provided with a centrally located first base electrode 12. Spaced therefrom and shaped as segments of an annular ring are emitter electrodes 14 and 15 on opposing sides of the base electrode 12. Considering the righthand side of the device as shown in FIGS. 1 and 2, adjacent the first emitter electrode 14 is a second base electrode 16 in the shape of a segment of an annular ring. The next electrode is an emitter electrode 18, also shaped as an annular segment. The last electrode on the righthand side is a third base electrode 20 and it also is shaped as an annular segment.

Referring to the lefthand side of the drawing of the device, the electrode adjacent emitter electrode 15 is a fourth base electrode 22. Spaced from the fourth base is a fourth emitter electrode 24 and the last electrode on the lefthand side is a fifth base electrode 26. Base electrodes 22 and 26 and emitter electrode 24 also are shaped as segments of an annular ring. Emitter electrode 18 is shorted to base electrode 22 by a low resistance path 30 that is in ohmic contact with each of these electrodes. Emitter electrodes 14, 15, 18 and 24 are of a conductivity type opposite to that of the main body 5 of the semiconductor material. Accordingly, there are provided additional junctions in the semiconductor body under each of these emitters, as at 14*a*, 15*a*, 18*a*, and 24*a* (see FIG. 2).

The cascading of the various base and emitter electrodes, whereby three transistors are provided in the resulting device, is accomplished by a bridging arrangement. A first bridge 32 that shorts base electrode 26 with emitter electrode 24 is provided. A second shorting arrangement comprising a bridge 34 that extends from emitter 14 to base 16 and then to base 20 is located on the righthand side of the device. The unit is completed by leads. Thus, an input lead 40 is in ohmic contact with the base electrode 12. A collector lead 42 is attached to the collector electrode 8, usually through the supporting structure (not shown) and an emitter electrode lead 44 is made to emitter 24 suitably by attachment to the bridge that shorts that emitter to base electrode 26.

Figure 3:
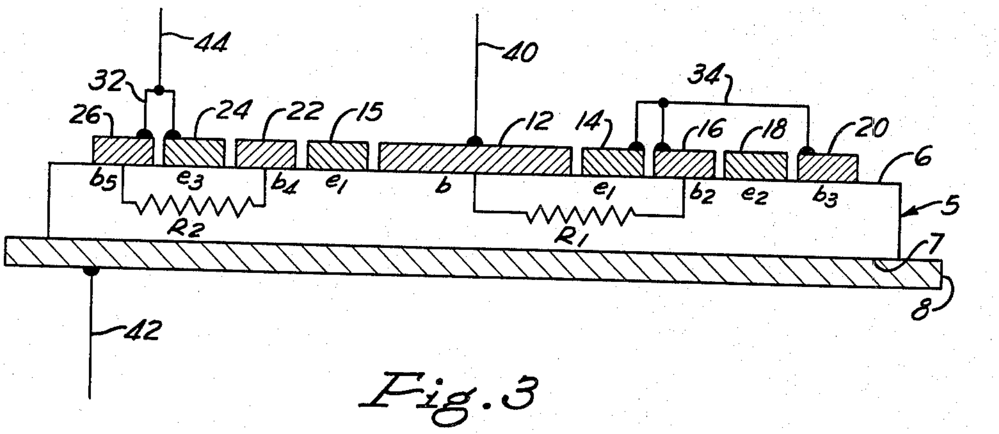
FIG. 3 shows, diagrammatically, portions of the semiconductor wafer as significant resistances.

With the shorting arrangement and lead attachment just disclosed, portions of the semiconductor body 5 become significant resistances with respect to the circuit of the device (see FIG. 3). There is a first significant resistance $R_1$ that extends through the semiconductor body 5 from the first base electrode 12 to the second base electrode 16. A second significant resistance extends between the base electrodes of the third transistor. This is the portion of the semiconductor body 5 that is shown as $R_2$ in FIG. 3 beneath emitter 24 and extends between base electrodes 22 and 26.

Figure 4:
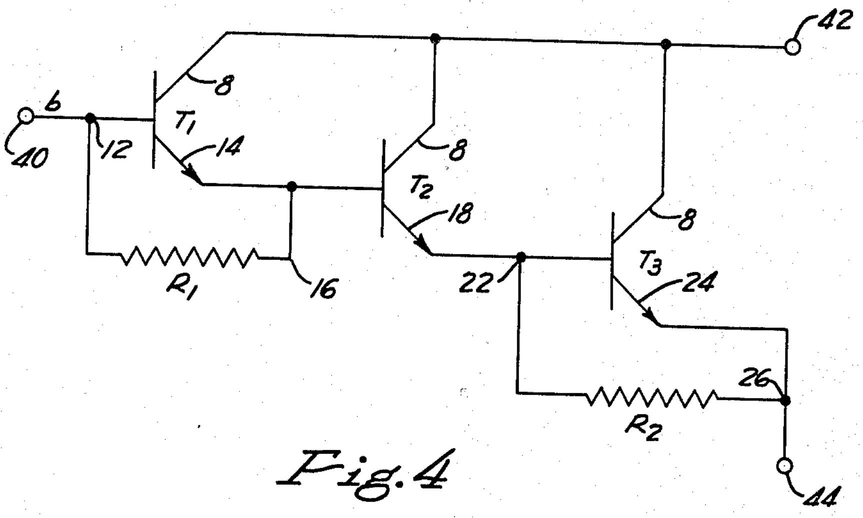
FIG. 4 is the equivalent circuit of the device of FIGS. 1, 2, and 3.

The equivalent diagram of the structure of FIGS. 1, 2 and 3 is shown in FIG. 4. As is apparent in FIG. 4, the device comprises three internally cascaded transistors in a PNP-PNP-PNP (or the converse) relationship. The first, or input, transistor is formed of base electrode 12, collector electrode 8 and emitter electrode 14. A second transistor is composed of base electrodes 16 and 20, emitter electrode 18 and the collector electrode 8. And a third transistor is composed of base electrodes 22 and 26, emitter electrode 24 and collector electrode 8. The emitter output from the first transistor leads into the base electrode 16 of the second transistor through the bridge 34. The emitter output of the second transistor leads from its emitter electrode 18 to the base electrode 22 of the third transistor through their joining member 30.

In the structure shown, the device is primarily a high gain power transistor. As such, the electrode 15 has no functional duty. It is included for practical reasons in producing power transistors because it aids in securing the intended spacing of the various electrodes, which, it will be appreciated, is quite tedious in view of the very small size of the parts. Since this electrode has no particular function, it will further be appreciated that it need not be composed of the emitter materials but, on the contrary, can be a simple base-type electrode. It is preferred, however, to make this an emitter electrode so that it will be available in the basic structure for such other use as may be desired.

Devices of this invention are produced by techniques that are now conventional in the art. For example, the various electrodes having the desired conductivity characteristics can simply be fused to a body of semiconductor material, and upon solidification, the indicated junctions will result in the usual manner. Thereafter, brazing, welding, thermocompression bonding or other means of joining leads to the electrodes, all of which are conventional, can be used. It is also apparent that the structure can be produced by diffusion techniques. By masking and photoresist techniques to expose preselected areas on the surfaces of the body of semiconductor material, and subjecting the thus exposed areas to an atmosphere of a conductivity impurity opposite to that in the main body of the semiconductor material, opposite conductivity concentrations, and P-N junctions, as needed are produced. Thereafter, metal can be evaporated on these concentrations and on the areas where base electrodes are desired so that good low resistance contact can be made to the various portions of the structure. Where bridges are needed, the semiconductor surface can first be oxidized, as by heating in air for a few minutes. Thereafter, metal is evaporated in place on the oxide coating to join the electrodes as described above. Then the excess oxide and metal are removed.

The invention will be further described in conjunction with the following specific example in which the details are given by way of illustration and not by way of limitation.

The semiconductor wafer 5 can be boron doped silicon and be characterized with properties such as a (111) orientation, a 50 to 150 ohm-cm. resistivity and a 200 microsecond lifetime. Typical dimensions of such a wafer are 0.0043 inch thick with a diameter of 0.500 inch. All of the electrodes suitably are made from gold foils on the order of 0.0015 inch thick. The collector foil 8 is circular with a diameter of 0.551 inch. The first base electrode 12 is circular with a diameter of 0.100 inch. The emitter electrodes 14 and 15 are approximately quarter segments of an annular ring having an inside diameter of 0.119 inch and an outside diameter of 0.188 inch. Base electrodes 16 and 22 are, respectively, a one-quarter and a one-third segment of an annular ring having an inside diameter of 0.197 inch and an outside diameter of 0.276. Emitter electrodes 18 and 24 are, respectively, a one-third segment and a one-quarter segment of an annular ring having an inside diameter of 0.285 inch and an outside diameter of 0.336 inch. The base electrodes 20 and 26 are quarter segments of an annular ring having an inside diameter of 0.372 inch and an outside diameter of 0.449 inch. Base electrodes 12, 16, 20, 22 and 26 are made from gold containing 0.3 weight percent of boron. The collector electrode 8 and emitter electrodes 14, 15, 18 and 24 have a nominal composition of 0.6 percent by weight of antimony and the remainder gold.

The structure is formed by placing the silicon wafer 5 on the collector electrode foil 8 and then arranging the base and emitter electrodes, as shown in FIGS. 1 and 2, on the upper surface of the silicon wafer. The electrodes are placed in a mold conforming to the general configuration of the device and heated, suitably in a vacuum of about $10^{-5}$ mm. of Hg, at about 700° C. for about 10 minutes to fuse the electrodes to the silicon wafer. The leads and bridges are attached by brazing gold plated silver wires to the various electrodes as shown. One particularly advantageous practice in this regard is to use wires bent in the form of double V's, with the V's being spaced as follows: The point of a first V of a first bridge is located between base electrode 26 and emitter electrode 24 with its sides contacting those electrodes, and the point of the other V of that bridge is placed on base electrode 12. The second bridge is located with one of its V's between emitter electrode 14 and base electrode 16 and its sides contacting those electrodes, and the point of its second V on the surface of base electrode 20. These bridges can be held in place by retaining springs and brazed to the unit by heating at about 400° C. for a few minutes. Thereafter, the bridge that shorts base 12 to base and emitter electrodes 26 and 24, respectively, is cut and the portion extending from base 12 is then used as one of the leads to the device. Similarly, the portion extending to the short between electrodes 24 and 26 can be used as a location for joining a second lead to the device. The third lead, to the collector, is usually attached to the heat sink supporting structure (not shown.)

The unit is then packaged for use in the conventional manner. That is, it is cleaned with a suitable mineral etchant, coated with a silicone varnish, and encapsulated. It will be appreciated that these practices are common in this art and form no part of the present inventive disclosure.

Devices as described above have been produced and tested qualitatively. As a power transistor, the device has shown a beta gain of 1500 at currents as high as 7.5 amperes, the highest gain at that high current of which I am aware.

It will be appreciated that variations can be made in the devices of the invention without departing from its scope. For example, the semiconductor material can be germanium or a compound semiconductor material such as silicon carbide, as well as silicon. Similarly, other P and N type conductivity impurities can be used. While engineering considerations may require that all electrodes of a given function be made of a single type material, it is evident that different materials with differing concentrations of significant impurities can be used without affecting the inventive concept. The shorting or bridging arrangement can also be varied. Electrodes 14 and 16 as well as electrodes 24 and 26 can be located so close to one another that they short in the desired fashion while being fused to the semiconductor wafer. Alternatively, bridges or low resistance paths can be provided between electrodes along their ends, thereby eliminating structure that passes over other structure. The shapes used for the crystal and the electrodes can be other than as shown, the characteristics of the electrodes being indicated by their current carrying requirements in the design produced. Other changes will occur to those skilled in the art.

The semiconductor devices of this invention can be used in any application where a high gain power transistor, or linear amplification, is needed. Particularly advantageous use can be made of these devices by substituting them for the plurality of individual interconnected units that now are needed to provide the gain that is characteristic of the present invention. The devices can be used in high fidelity equipment, television circuits and the like at frequencies up to about 20 kc. The advantages of these devices include the high gain at high reliability, fewer connections for a given result, applicability to production line techniques and smaller size.

In accordance with the provisions of the patent statutes, the invention has been described with what is now believed to be its best embodiment. However, it should be understood that it can be practiced other than as specifically illustrated and described.

I claim:

A semiconductor device comprising a generally circular body of semiconductor material of one conductivity type and having opposed major surfaces, an opposite conductivity type collector electrode fused to one of said major surfaces and producing in said body a fused P-N junction, a circular first base electrode centrally located in non-rectifying contact with said other major surface of said semiconductor body, a first emitter electrode of opposite conductivity type, shaped as a segment of an annular ring and having a size of less than half said annular ring fused to said other surface of the semiconductor body adjacent said first base electrode and producing in said body a P-N junction, a second base electrode in non-rectifying contact with said other surface of the semiconductor body and spaced from said first base electrode by said first emitter electrode, a second emitter electrode of opposite conductivity type fused to said other surface of the semiconductor body and producing in the semiconductor body a P-N junction, the second emitter being spaced from the first emitter electrode by the second base electrode, a third base electrode in non-rectifying contact with said other surface of the semiconductor body and spaced from the second base electrode by the second emitter electrode, a fourth base electrode in non-rectifying contact with said other surface of said semiconductor material, said fourth base electrode being spaced from said first base electrode on a side opposite to said first emitter electrode, a third emitter electrode of opposite conductivity type fused to said other surface of said semiconductor material and producing in said body a P-N junction, said third emitter electrode being spaced from said first base electrode by the fourth base electrode, a fifth base electrode in non-rectifying contact with said other surface of said semiconductor material and spaced from said fourth base electrode by the third emitter electrode, each of said second, third, fourth and fifth base electrodes and said second and third emitter electrodes being shaped as segments of annular rings and each having a size less than half of the ring of which it is a segment, said emitter electrodes and said base electrodes shaped as segments of annular rings being disposed so as to form portions of four circles which are concentric with said circular first base electrode, said first emitter electrode being a portion of a first circle, said second and fourth base electrodes being portions of a second circle, said second and third emitter electrodes being portions of a third circle, said third and fifth base electrodes being portions of a fourth circle, a first low resistance path joining said second emitter electrode and said fourth base electrode disposed on and in contact with said other surface of said circular body, a second low resistance path joining said third emitter electrode and said fifth base electrode and a third low resistance path joining the second and third base electrodes to one another and to the first emitter electrode, a first electrical lead joined to said first base electrode, a second electrical lead joined to said collector electrode and a third electrical lead joined to said second low resistance path to provide a high gain transistor having three stages of amplification.

References Cited in the file of this patent

UNITED STATES PATENTS

| | | |
|---|---|---|
| 2,663,806 | Darlington | Dec. 22, 1953 |
| 2,981,877 | Noyce | Apr. 25, 1961 |
| 2,985,804 | Buie | May 23, 1961 |
| 3,029,366 | Lehovec | Apr. 10, 1962 |
| 3,046,405 | Emeis | July 24, 1962 |

FOREIGN PATENTS

| | | |
|---|---|---|
| 1,212,682 | France | Mar. 25, 1960 |